United States Patent
Cheung et al.

(10) Patent No.: US 9,461,151 B2
(45) Date of Patent: Oct. 4, 2016

(54) DUAL STORAGE NODE MEMORY

(71) Applicant: Cypress Semiconductor Corporation, San Jose, CA (US)

(72) Inventors: Fred T. K. Cheung, San Jose, CA (US); Hiroyuki Kinoshita, Sunnyvale, CA (US); Chungho Lee, Sunnyvale, CA (US); Yu Sun, Saratoga, CA (US); Chi Chang, Redwood City, CA (US)

(73) Assignee: CYRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/033,170

(22) Filed: Sep. 20, 2013

(65) Prior Publication Data

US 2014/0024190 A1    Jan. 23, 2014

Related U.S. Application Data

(62) Division of application No. 11/702,845, filed on Feb. 5, 2007, now Pat. No. 8,564,042.

(60) Provisional application No. 60/765,227, filed on Feb. 3, 2006.

(51) Int. Cl.

| | |
|---|---|
| H01L 21/336 | (2006.01) |
| H01L 29/66 | (2006.01) |
| G11C 16/04 | (2006.01) |
| G11C 16/34 | (2006.01) |
| H01L 27/115 | (2006.01) |

(52) U.S. Cl.
CPC ..... *H01L 29/66833* (2013.01); *G11C 16/0475* (2013.01); *G11C 16/3418* (2013.01); *G11C 16/3427* (2013.01); *H01L 27/115* (2013.01); *H01L 27/11521* (2013.01)

(58) Field of Classification Search
CPC .................... H01L 21/28282; H01L 27/11568
USPC ......................................... 438/288
See application file for complete search history.

(56) References Cited

U.S. PATENT DOCUMENTS

| | | | |
|---|---|---|---|
| 6,905,932 B2 * | 6/2005 | Howard et al. | 438/291 |
| 6,927,131 B2 | 8/2005 | Kim | |
| 7,368,347 B2 | 5/2008 | Joshi et al. | |
| 7,485,533 B2 * | 2/2009 | Lee | 438/261 |
| 7,618,864 B2 * | 11/2009 | Oh et al. | 438/261 |
| 8,564,042 B2 | 10/2013 | Cheung et al. | |

OTHER PUBLICATIONS

U.S. Appl. No. 14/033,170: "Dual Storage Node Memory," Fred Cheung et al., filed Sep. 20, 2013; 34 pages.
USPTO Final Rejection for U.S. Appl. No. 11/702,845 dated Feb. 2, 2010; 11 pages.
USPTO Final Rejection for U.S. Appl. No. 11/702,845 dated May 24, 2011; 11 pages.

(Continued)

*Primary Examiner* — Jack Chen

(57) ABSTRACT

An embodiment of the present invention is directed to a memory cell. The memory cell includes a first charge storage element and a second charge storage element, wherein the first and second charge storage elements include nitrides. The memory cell further includes an insulating layer formed between the first and second charge storage elements. The insulating layer provides insulation between the first and second charge storage elements.

10 Claims, 11 Drawing Sheets

(56) References Cited

OTHER PUBLICATIONS

USPTO Final Rejection for U.S. Appl. No. 11/702,845 dated Dec. 7, 2011; 10 pages.
USPTO Non-Final Rejection for U.S. Appl. No. 11/702,845 dated Oct. 1, 2009; 9 pages.
USPTO Non-Final Rejection for U.S. Appl. No. 11/702,845 dated Oct. 7, 2011; 9 pages.
USPTO Non-Final Rejection for U.S. Appl. No. 11/702,845 dated Dec. 22, 2010; 10 pages.
USPTO Notice of Allowance for U.S. Appl. No. 11/702,845 dated Jun. 20, 2013; 9 pages.

* cited by examiner

DUAL STORAGE NODE MEMORY

CROSS-REFERENCE TO RELATED APPLICATIONS

This application is a divisional of U.S. patent application Ser. No. 11/702,845, filed on Feb. 5, 2007, entitled "Dual Storage Node Memory," which claims priority to U.S. Provisional Patent Application No. 60/765,227, entitled "Method of Fabricating Dual Storage Nodes Memory Using Spacer Mask," filed Feb. 3, 2006, which are hereby incorporated herein by reference in their entirety.

BACKGROUND

In recent years, dual bit memory cells, such as those employing MirrorBit® technology developed by Spansion, Inc., have been developed. As the name suggests, dual bit memory cells double the intrinsic density of a flash memory array by storing two physically distinct bits on opposite sides of a memory cell. Reading programming, or erasing one side of a memory cell occurs independently of whatever data is stored on the opposite side of the cell.

FIG. 1A illustrates a conventional dual-bit memory cell 100. Conventional dual bit memory cell 100 typically includes a substrate 110 with source/drain regions 120 implanted therein, a first oxide layer 130 above the substrate 110, a continuous charge trapping layer 140, a second oxide layer 150, and a poly layer 160. The bottom oxide layer 130 is also commonly referred to as a tunnel oxide layer.

Programming of a dual bit memory cell 100 can be accomplished, for example, by hot electron injection. Hot electron injection involves applying appropriate voltage potentials to the gate, source, and drain of the cell 100 for a specified duration until the charge trapping layer 140 accumulates charge. While for simplicity, charge is typically thought of as being stored in a fixed location (i.e., the edges) of charge trapping layer 140, in reality the location of the trapped charge for each node falls under a probability curve, such as curves 170 and 175. For the purposes of this discussion the bit associated with curve 170 shall be referred to as the "normal bit" and the bit associated with curve 175 shall be referred to as the "complementary bit". It should be appreciated from FIG. 1A that the memory cell 100 illustrated therein is reasonably large, such that the two charge storage nodes can be fairly localized and well separated.

FIG. 1B illustrates a conventional dual bit memory cell 105 having a smaller process geometry than the memory cell 100 of FIG. 1A. FIG. 1B illustrates that as the cell gets smaller, the distribution curves 170 and 175 stay the same, resulting in an overlap of the curves 170 and 175. Such an overlap in these regions can result in the contamination of one bit by its neighboring bit. This is also known as complementary bit disturb or program disturb.

FIG. 2 graphically illustrates complementary bit disturb in a conventional memory cell having a continuous charge trapping layer. FIG. 2 illustrates the example of when the normal bit has been programmed, but the complementary bit has not. In such a case, the normal bit should read "0" and the complementary bit should read "1". Whether or not a bit is programmed is reflected by a delta in the threshold voltage associated with that bit. In conventional dual bit memory cells, programming of a normal bit also results in a shift of the $V_t$ of the complementary bit. For example, in a memory cell having a channel length L1, changing the $V_t$ of the normal bit by X results in a change of the $V_t$ of the complementary bit of Y. As the cell size gets smaller, resulting in a shorter channel length (e.g., L2), the disturbance increases, even before the bits physically touch each other. Thus, conventional dual bit memory cells do not have adequate protection against physical contamination of one bit by its neighboring bit, as well as protection against program disturb in general.

Erasure of a dual bit memory cell can be accomplished using, for example, the conventional technique of "hot hole injection" (sometimes referred to as band-to-band (BTB) hot hole injection). In hot hole injection, appropriate voltages are applied to the gate and a drain, while the source is floated or grounded, to erase one of the memory cells (typically the normal bit). Conversely, the complementary bit cell is erased by floating the drain and applying the appropriate voltages to the source and the gate. With such erase conditions, a BTB tunnel current is created under the gate. Holes are generated under these conditions and accelerate from the n-type drain region into the p-type substrate. The generated holes are accelerated in the electrical field created near the P—N drain/body junction. Some of the accelerated holes surmount the oxide-to-silicon interface between the substrate and the bottom oxide and are injected into the nitride layer to displace electrons (e.g., by recombination) and erase the cell. However, as these hot holes bombard the interface between the substrate and the bottom oxide, the interface, as well as the bottom oxide, is damaged causing undesirable interface states and degraded reliability over program/erase cycling.

Another erase mechanism is channel erase, also commonly referred to as a Fowler-Nordheim (FN) erase operation. Typically, in conventional dual bit memory cells, the top and bottom oxide have the same and dielectric constant, resulting in the vertical fields during erase being the same across both the top and bottom oxides. Therefore, during an FN channel erase, electrons are pushed out from the charge restoring layer to the substrate. At the same time, more electrons flow from the N+ gate through the top oxide and get trapped in the charge storing layer. Therefore while there is a net current from the control gate to the substrate, charge is not erased effectively from the charge storing layer.

In addition to the specific issues related to dual bit memory cells, decreasing memory cell channel length in general also raises several other issues, commonly referred to as the "short channel effect." For instance, short channel effect may refer to source/drain leakage issues, loss of gate control issues, etc.

SUMMARY

An embodiment of the present invention is directed to memory cell. The memory cell includes a first charge storage layer and a second charge storage layer, wherein the first and second charge storage layers include nitrides. The memory cell further includes an insulating layer formed between the first and second multilayers. The insulating layer provides insulation between the first and second charge storage layers.

Thus, embodiments provide for dual storage node memory cells with physical separation of the storage nodes by an insulator. Such separation of the storage nodes prevents program disturb between the two storage nodes, which is a critical issue as process geometries continue to decrease. Additionally, increased channel length can be effected by forming a trench in the semiconductor substrate between bit lines.

DETAILED DESCRIPTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

Briefly stated, embodiments reduce the likelihood of program disturb in a dual bit memory cell through physical separation of the charge storage nodes by an insulator. Because two separate charge storage layers are used, rather than one continuous charge storage layer, the separate charge storage nodes are insulated from each other.

Exemplary Memory Cell in Accordance with an Embodiment

Figure 1A:
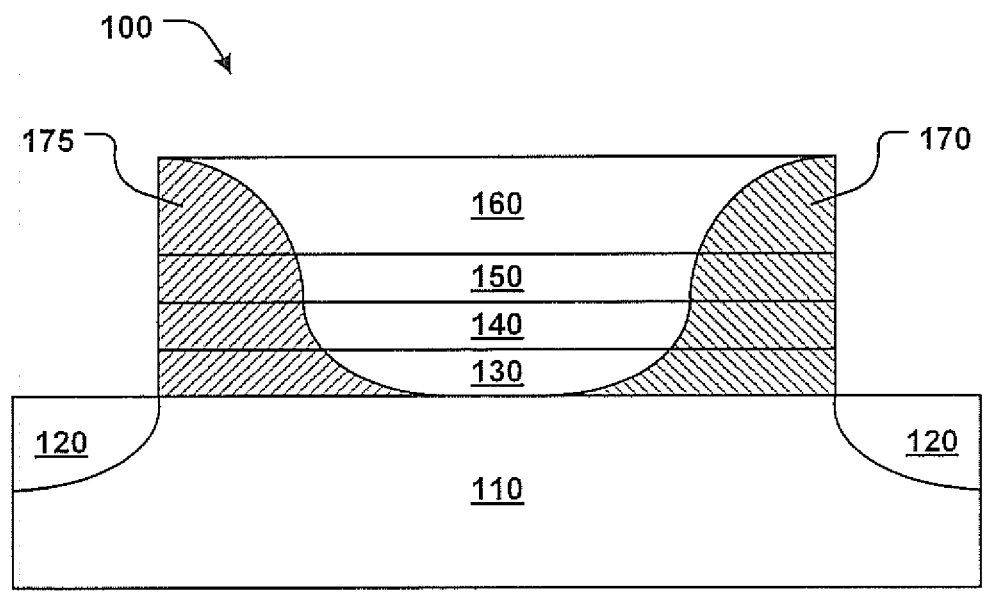
FIG. 1A illustrates a conventional dual-bit memory cell.
Figure 1B:
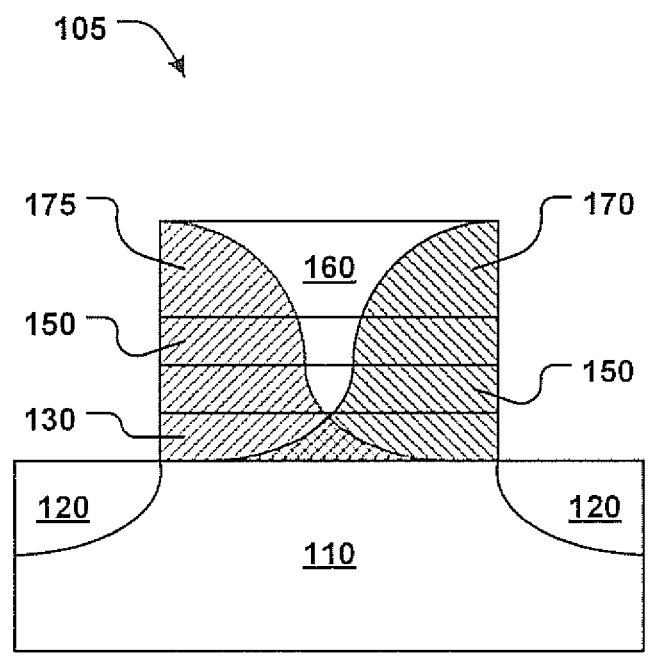
FIG. 1B illustrates a conventional dual bit memory cell having a smaller process geometry than the memory cell of FIG. 1A.
Figure 2:
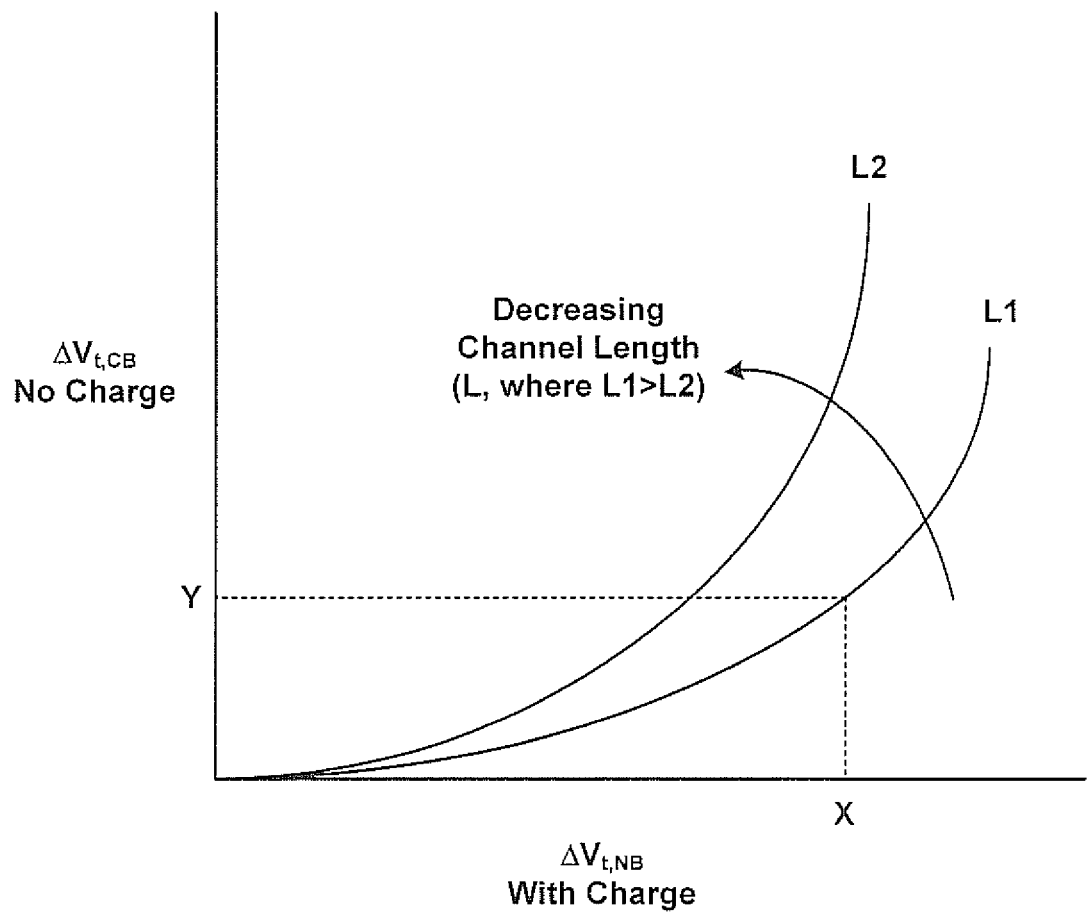
FIG. 2 graphically illustrates complementary bit disturb in a conventional memory cell having a continuous charge trapping layer.
Figure 3:
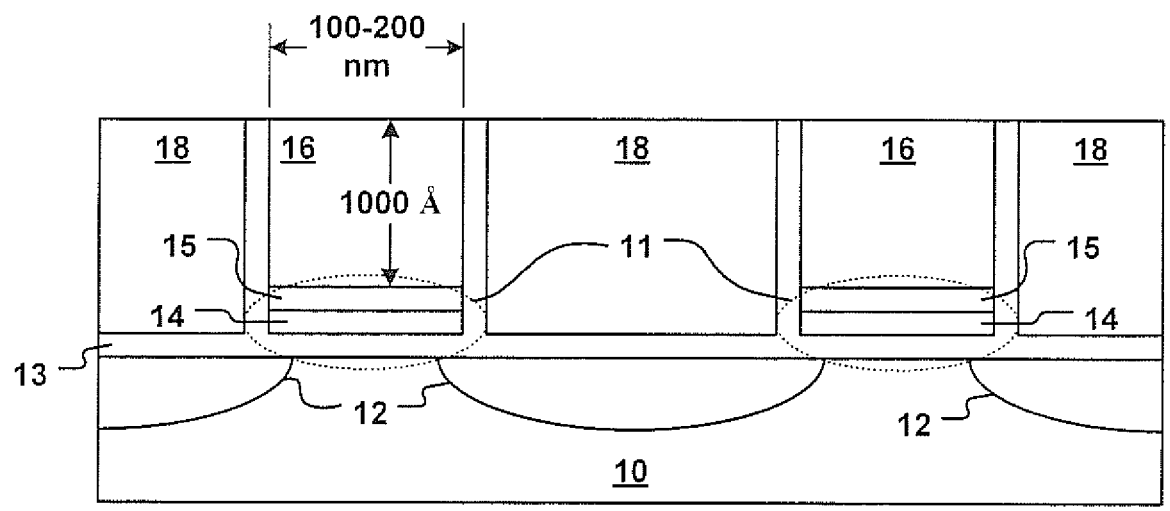
FIG. 3 illustrates a cross-sectional view of an exemplary semiconductor device illustrating a substrate and a preliminary gate structure, in accordance with various embodiments of the present invention.

FIG. 3 illustrates a cross-sectional view of an exemplary semiconductor device, in accordance with various embodiments of the present invention. The device includes a substrate 10, which has a plurality of spaced bit lines 12 formed therein. The bit lines are formed by ion implantation and diffusion between hard masks 16. The hard masks 16 may be poly-silicon, oxide, nitride, or the like. The device also includes a multilayer 11 formed over the substrate. The multilayer 11 includes a first oxide layer 13 formed over the substrate 10, a charge storage layer 14 formed over the first oxide layer 13, and a second oxide layer 15 formed over the charge storage material 14. In one embodiment, the first oxide layer 13, charge storage material 14, and second oxide layer 15 thicknesses are in the range of 30-100 Å, 50-120 Å, and 30-100 Å, respectively. Furthermore, in one embodiment, the multilayer 11 has a width in the range of 100-200 nm. In other embodiments, other thicknesses of the first oxide layer 13, charge storage material 14, second oxide layer 15, and the multilayer 11 in general can be employed and can be either thicker or thinner than those values listed.

The charge storage layer 14 may be one of a number of materials, including silicon nitride (SiN), silicon rich nitride (SiRN), polysilicon, and high-K materials. It should be appreciated by one of skill in the art that although polysilicon and nitride materials may be used, the properties of the two materials are very different. For example, polysilicon is a conductor, which means that an electron may freely move throughout the material. By contrast, nitrides such as SiN and SiRN are insulators, wherein the location of a given electron stays relatively constant.

In one embodiment, the space between the hard masks 16 is then filled with a silicon oxide 18 such as high-density plasma oxide, which is on the order of 1000 angstroms in thickness and will provide isolation between the underlying bit line and an overlying word line (discussed below). In other embodiments, other thicknesses of the silicon oxide 18 may be used.

Figure 4:
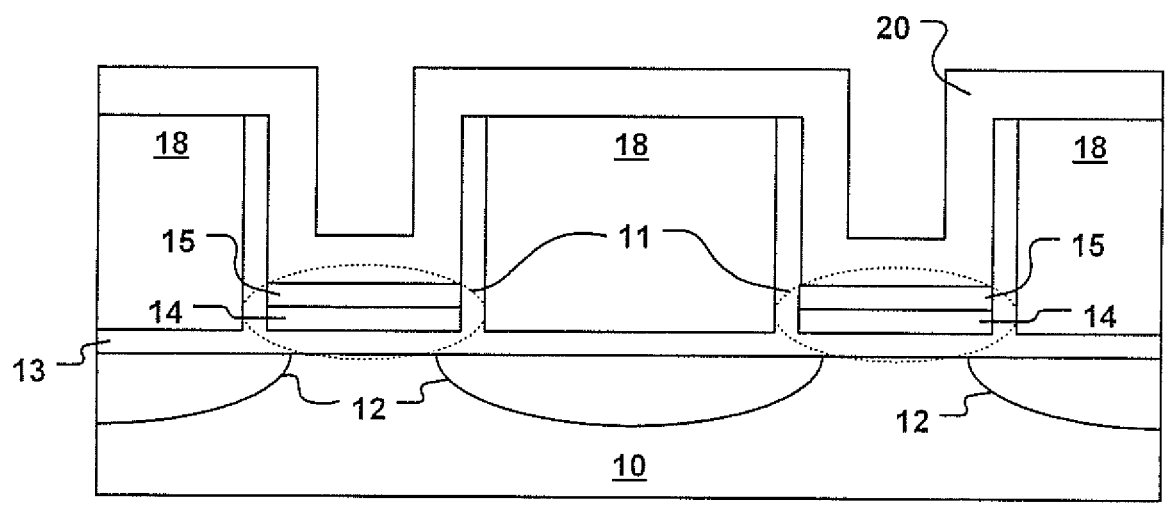
FIG. 4 illustrates a cross-sectional view of an exemplary semiconductor device illustrating a substrate, a preliminary gate structure, and spacer material, in accordance with various embodiments of the present invention.

As shown in FIG. 4, the hard mask 16 is removed, exposing the multilayer 11. The hard mask may be removed by dry or wet etch, for example. After the hard mask 16 is removed, a selectively etchable spacer material 20 is formed in the space between the silicon oxide 18 and above the multilayer 11. It should be appreciated that spacer material 20 may include a number of materials, such as silicon nitride or any other polymeric materials.

Figure 5:
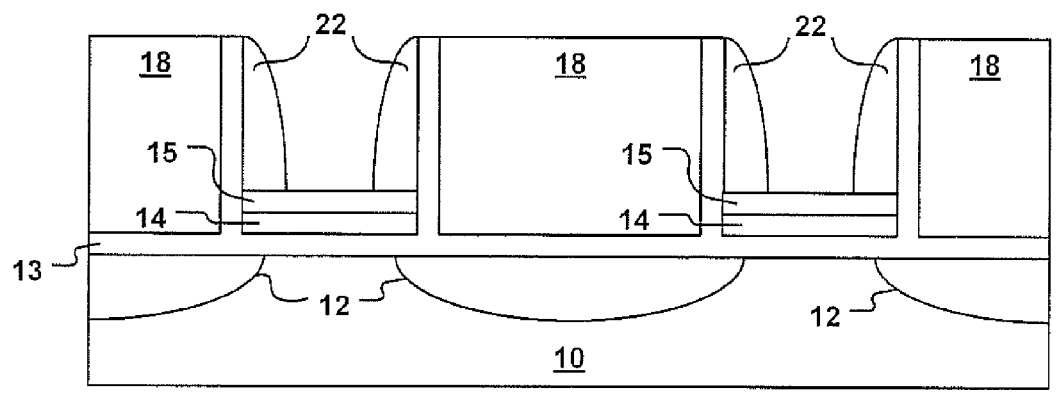
FIG. 5 illustrates a cross-sectional view of an exemplary semiconductor device illustrating spacer material etched to form sidewall spacers, in accordance with various embodiments of the present invention.

As shown in FIG. 5, the spacer material 20 of FIG. 4 is selectively etched to form sidewall spacers 22. The spacer material 20 may be etched using a dry etch or a wet etch. Sidewall spacers 22 serve to expose a selected portion of the top oxide layer 15.

Figure 6:
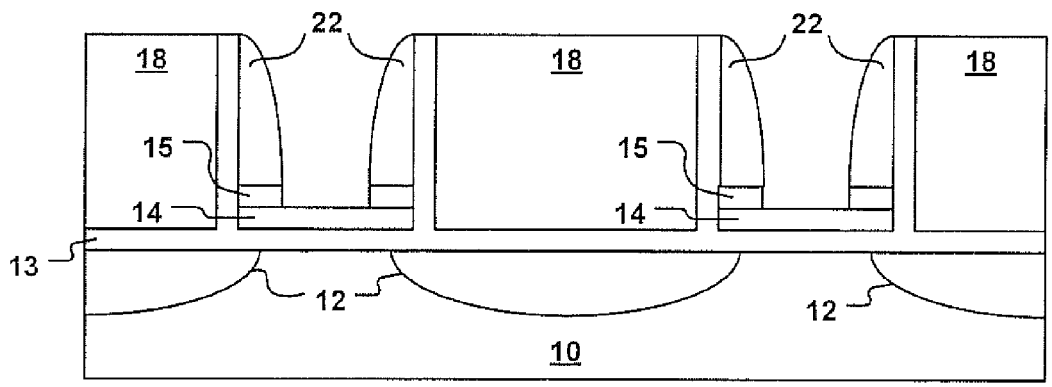
FIG. 6 illustrates a cross-sectional view of an exemplary semiconductor device illustrating the removal of a portion of the top oxide layer, in accordance with various embodiments of the present invention.

As shown in FIG. 6, after the sidewall spacers 22 are formed, a portion of the second oxide layer 15 of the multilayer 11 is removed by an etchant such as diluted HF or the like. Thereafter, the sidewall spacers 22 are removed by dry or wet etch. Next, the exposed portion of the charge storage layer 14 is removed. It should be appreciated that this may be done in a number of ways. For example, the charge storage layer 14 may be removed by etching prior to the removal of the sidewall spacers 22. The charge storage layer 14 may also be removed by oxidation, whereby the material of the charge storage layer 14 is chemically converted to an oxide. It should be appreciated that a combination of the above methods may also be used. Removing the center portion of the charge storage material 14 results in a gate structure having two physically separate multilayer charge storage nodes 26, 28.

Figure 7:
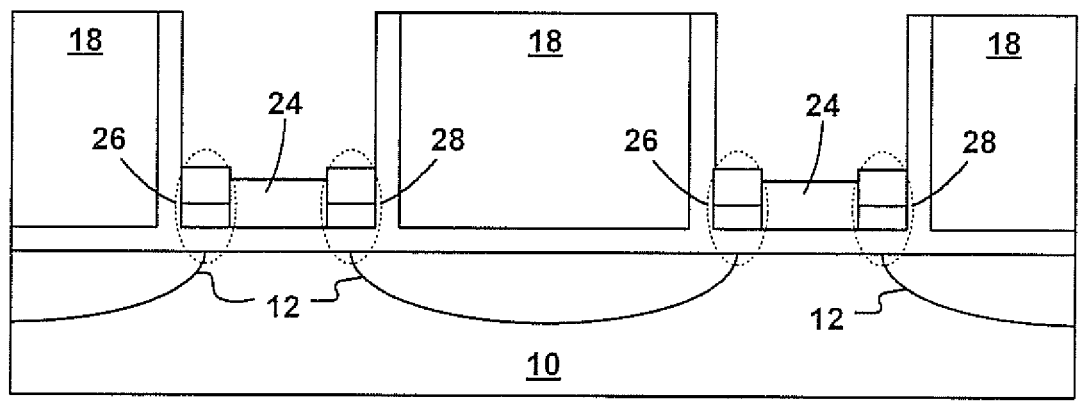
FIG. 7 illustrates a cross-sectional view of an exemplary semiconductor device having two charge storage nodes physically separated by an insulating material, in accordance with various embodiments of the present invention.
Figure 8:
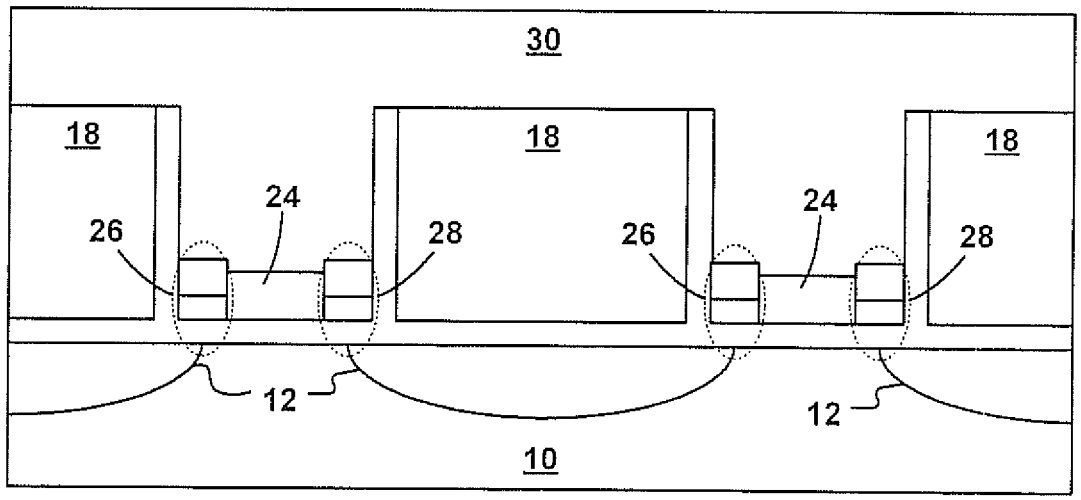
FIG. 8 illustrates a cross-sectional view of an exemplary semiconductor device illustrating the formation of a polysilicon layer, in accordance with various embodiments of the present invention.

As illustrated in FIG. 7, an insulating material 24 is formed where the exposed portion of the charge storage material 14 was removed. In one embodiment, the insulating material 24 is a gate silicon oxide. It should be appreciated that when the charge storage material 14 is removed by means of oxidation, the oxidation replaces the charge storage material 14 with an oxide in a single step. Insulating material 24 thereby physically separates the two charge storage nodes 26, 28 and functions as a gate oxide. Thereafter, as illustrated in FIG. 8, a conductive material such as polysilicon or the like is formed over the oxide pillars 18 and the charge storage nodes 26 and 28 separated by the insulating material 24. The conductive material is then subsequently etched to define a plurality of word lines 30 overlying the substrate array. In one embodiment, charge storage nodes 26 and 28 have widths in the range of 20-50 nm. In other embodiments, the charge storage nodes 26 and 28 may have widths that are wider or narrower than those dimensions provided.

Figure 9:
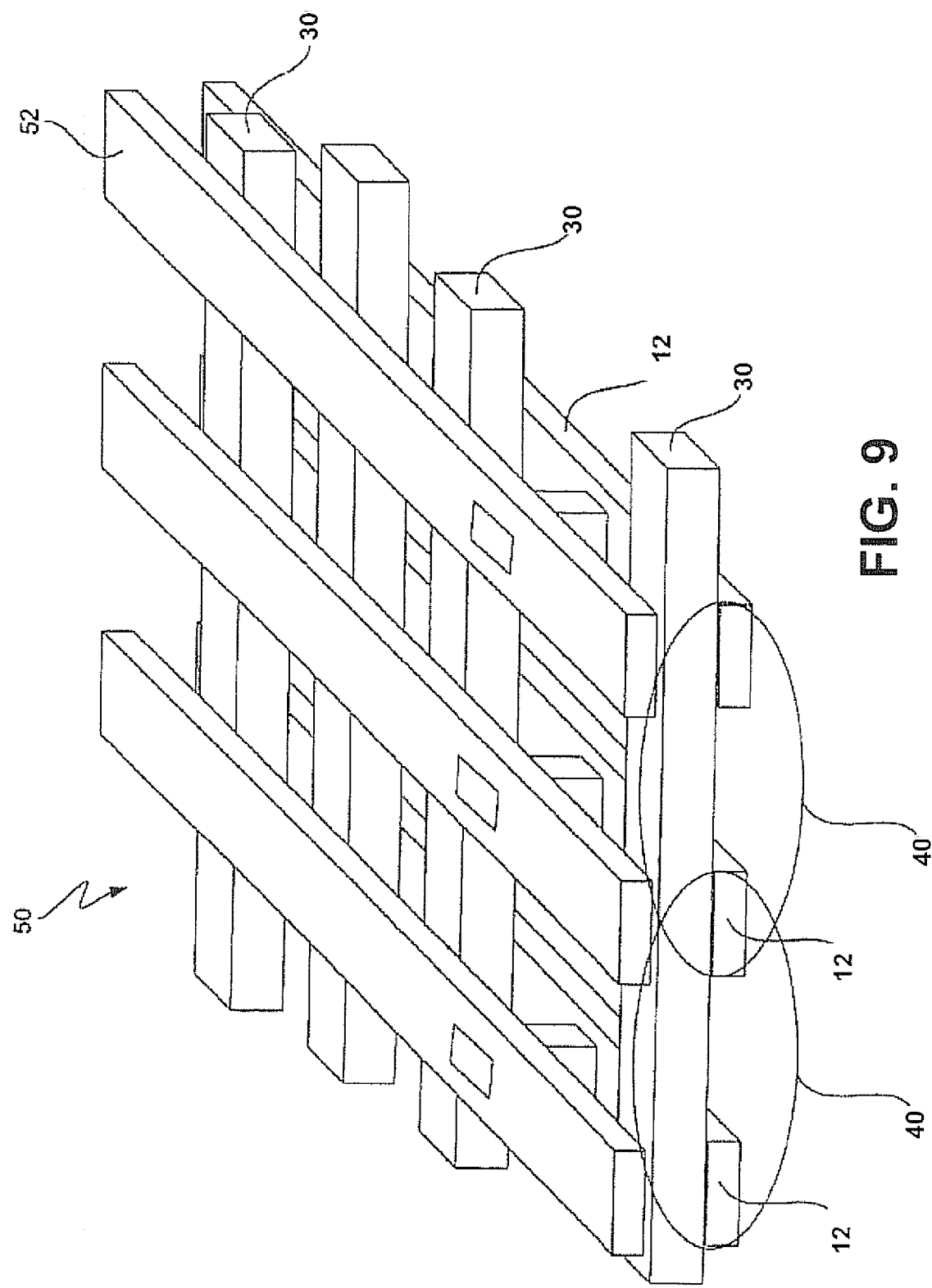
FIG. 9 is an array architecture using flash memory cells, in accordance with various embodiments of the present invention.

FIG. 9 illustrates an array architecture and 50 using flash memory cells 40, in accordance with various embodiments of the present invention. The array 50 includes a plurality of the word lines 30 running in one direction and a plurality of overlying metal interconnects 52 running in the perpendicular direction. The metal interconnects 52 deliver voltage to the underlying source/drain regions 12 through metal interconnects 53. FIG. 5 shows two adjacent cells 10, which share a common source/drain region 12. The cells 40 according to embodiments of the present invention can be substituted in place of the aforementioned planar cell currently used in the MirrorBit® technology mentioned above, and described in detail in U.S. Pat. Nos. 6,861,307, 6,917,068, 6,639,271, 6,215,702, and 2004/0021172, each of which are incorporated by reference herein for all purposes.

Figure 10:
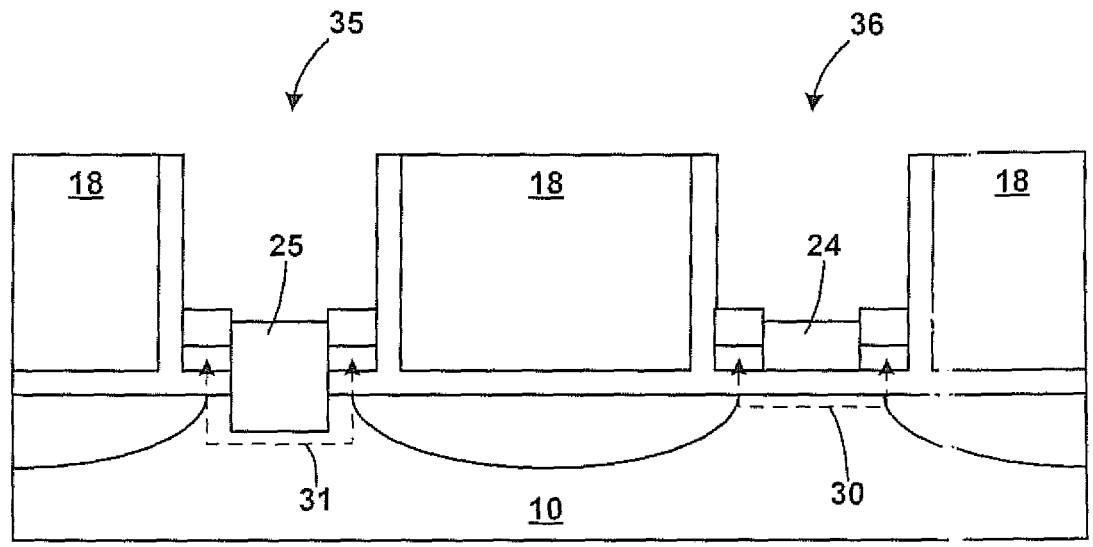
FIG. 10 illustrates how the channel length is increased by a having shallow trench etched in the substrate.

In various embodiments, the channel length of the memory cell may be increased by forming an additional trench in the substrate 10. It should be appreciated this may be done in a number of ways. For example, in one embodiment shallow trenches are formed in the substrate between adjacent bit lines prior to forming the multilayer. Thus the channel length is increased without adjusting the size of the memory cell itself. In another embodiment, shallow trenches are formed in the substrate between adjacent bit lines after the exposed portions of the top oxide layer 15 and the charge storage layer 14 have been removed. FIG. 10 illustrates how the channel length is increased by a shallow trench etched in the substrate 10. For the purposes of illustration, a trench has been etched in the substrate 10 for memory cell 35, but not for memory cell 36, and then filled with insulating material 25. Dashed arrow 30 approximates the channel length for memory cell 36, and dashed arrow 31 approximates the channel length for memory cell 35. It should be appreciated that the channel length indicated by dashed arrow 31 is longer than the channel length indicated by dashed arrow 30. It should be appreciated that this unique channel geometry can promote hot electron injection programming efficiency. Consequently, programming speed can be improved. Furthermore, because of the use of a silicon rich nitride or poly silicon in the formation of charge storage layer 14, charges can be removed more efficiently from charge storage nodes 26, 28. The Fowler-Nordheim (FN) erase can therefore be more readily used, resulting in improved reliability.

Exemplary Methods of Fabrication According to Various Embodiments

Figure 11:
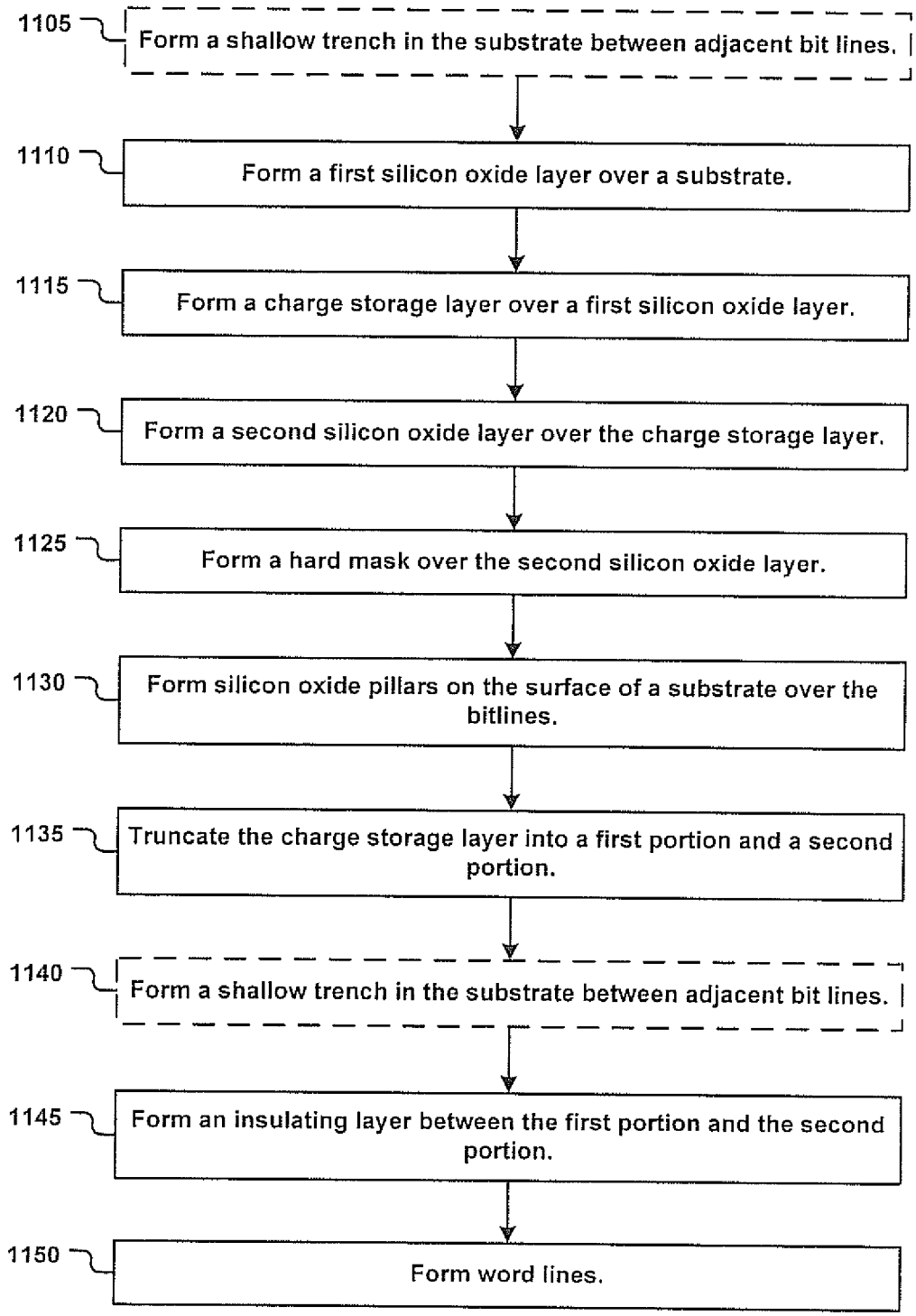
FIG. 11 illustrates a flowchart for a process of fabricating space storage nodes on a surface of a substrate between two adjacent bit lines, in accordance with various embodiments of the present invention.
Figure 12:
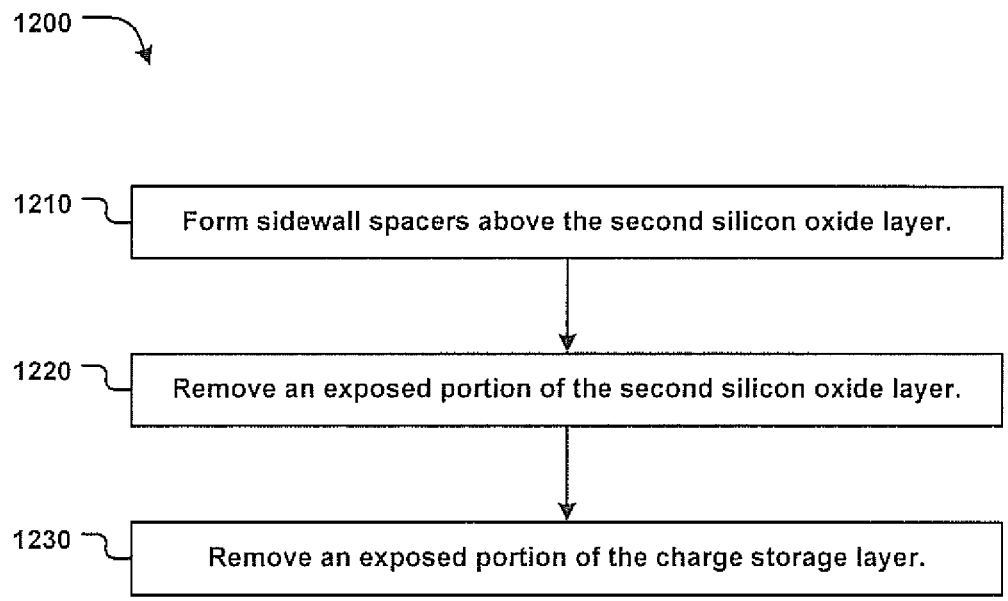
FIG. 12 illustrates a flowchart for a process of truncating a charge storage layer into a first portion and a second portion, in accordance with an embodiment of the present invention.
Figure 13:
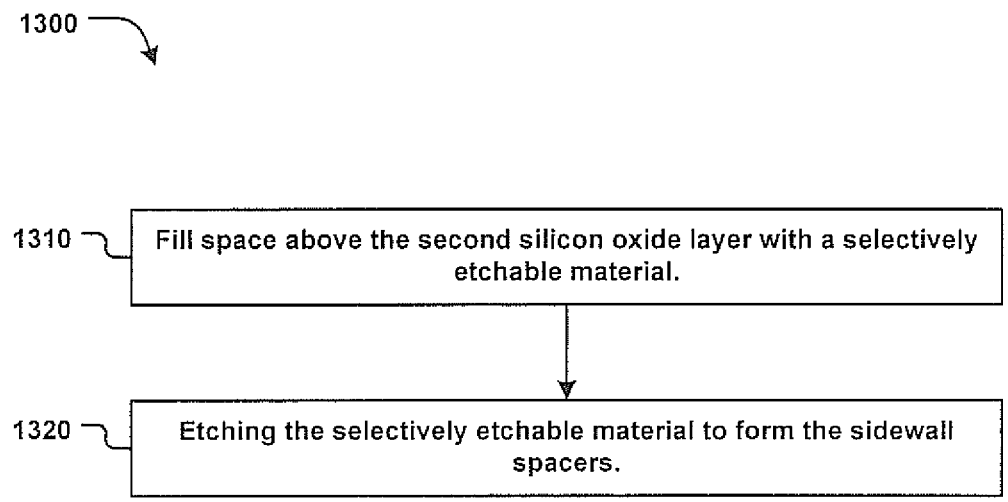
FIG. 13 illustrates a flowchart of a process for forming sidewall spacers, in accordance with an embodiment of the present invention.

The following discussion sets forth in detail processes of fabrication according to various embodiments. With reference to FIGS. 11-13, flowcharts 1100, 1200, and 1300 each illustrate example fabrication steps used and various embodiments. Although specific steps are disclosed in flowcharts 1100, 1200, and 1300, such steps are examples. That is, embodiments are well suited to using various other steps or variations of the steps recited in flowcharts 1100, 1200, and 1300. It is appreciated that the steps in flowcharts 1100, 1200, and 1300 may be performed in an order different than presented, and that not all of the steps in flowcharts 1100, 1200, and 1300 may be performed.

FIG. 11 illustrates a flowchart 1100 for a process of fabricating spaced storage nodes on a surface of a substrate between two adjacent bit lines, in accordance with various embodiments of the present invention. At block 1110, a first silicon oxide layer 13 is formed over a substrate 10. At block 1115, a charge storage layer 14 is formed over the first silicon oxide layer 13. The charge storage layer 14 may be one of a number of materials, including silicon nitride (SiN), silicon rich nitride (SiRN), polysilicon, and high-K materials. At block 1120, a second silicon oxide layer 15 is formed over the charge storage layer 14. Next, at block 1125, a hard mask 16 is formed over the second silicon oxide layer 15. Silicon oxide pillars 18 are then formed on the surface of the substrate 10 over the bit lines 12 (block 1130).

At block 1135, the charge storage layer 14 is truncated into a first portion 26 and a second portion 28. It should be appreciated that this may be achieved in a number of ways. For example, FIG. 12 illustrates a flowchart 1200 for a process of truncating a charge storage layer 14 into a first portion 26 and a second portion 28, in accordance with an embodiment of the present invention. At block 1210, sidewall spacers 22 are formed above the second silicon oxide layer 15. At block 1220, an exposed portion of the second silicon oxide layer 15 is removed. Next, an exposed portion of the charge storage layer 14 is removed (block 1230). In one embodiment, the exposed portion of the charge storage layer 14 is removed by etching. In another embodiment, the exposed portion of the charge storage layer 14 is removed by oxidation. It should be appreciated that if oxidation is used, blocks 1220 and 1230 may be achieved in a single step. Furthermore, it should be appreciated that the sidewall spacers 22 may be formed in a number of ways. For example, FIG. 13 illustrates a flowchart 1300 of a process for forming sidewall spacers 22, in accordance with an embodiment of the present invention. At block 1310, space above the second oxide layer 15 is filled with a selectively etchable material 20. The selectively etchable material 20 is then etched to form the sidewall spacers 22 (block 1320).

With reference again to FIG. 11, after the charge storage layer 14 has been truncated, an insulating layer 24 is formed between the first portion 26 and the second portion 28 of the charge storage layer 14 (block 1145). Consequently, the first portion 26 and the second portion 28 are isolated from each other, thereby creating two physically separate charge storage elements. Thereafter, a conductive material such as polysilicon or the like is formed over the oxide pillars 18 and the first and second portions 26, 28 separated by the insulating material 24. The conductive material is then subsequently etched to define a plurality of word lines 30 overlying the substrate array (block 1150).

In various embodiments, the channel length of the memory cell may be increased by forming an additional trench in the substrate 10 between adjacent bit lines 12 (blocks 1105 and 1140). It should be appreciated this may be done in a number of ways. For example, in one embodiment shallow trenches are formed in the substrate 10 between adjacent bit lines 12 prior to forming the multilayer 11 (block 1105). In another embodiment, shallow trenches are formed in the substrate 10 between adjacent bit lines 12 after the exposed portions of the top oxide layer 15 and the charge storage layer 14 have been removed (block 1140). Thus the channel length is increased without adjusting the size of the memory cell itself. A detailed explanation of how additional trenching of the substrate 10 results in an elongated channel may be found above with reference to FIG. 10 and need not be repeated here.

Exemplary Operating Environments According to One Embodiment

Embodiments generally relate to semiconductor devices. More particularly, embodiments provide for a nonvolatile storage device having a dual bit memory cell with physically separated storage nodes. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, portable multimedia devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.). Since flash memory is widely used in such devices, and users would desire the devices to have as large a storage capacity as possible, an increase in memory density would be advantageous. Users would also benefit from reduced memory read time and reduced cost.

Figure 14:
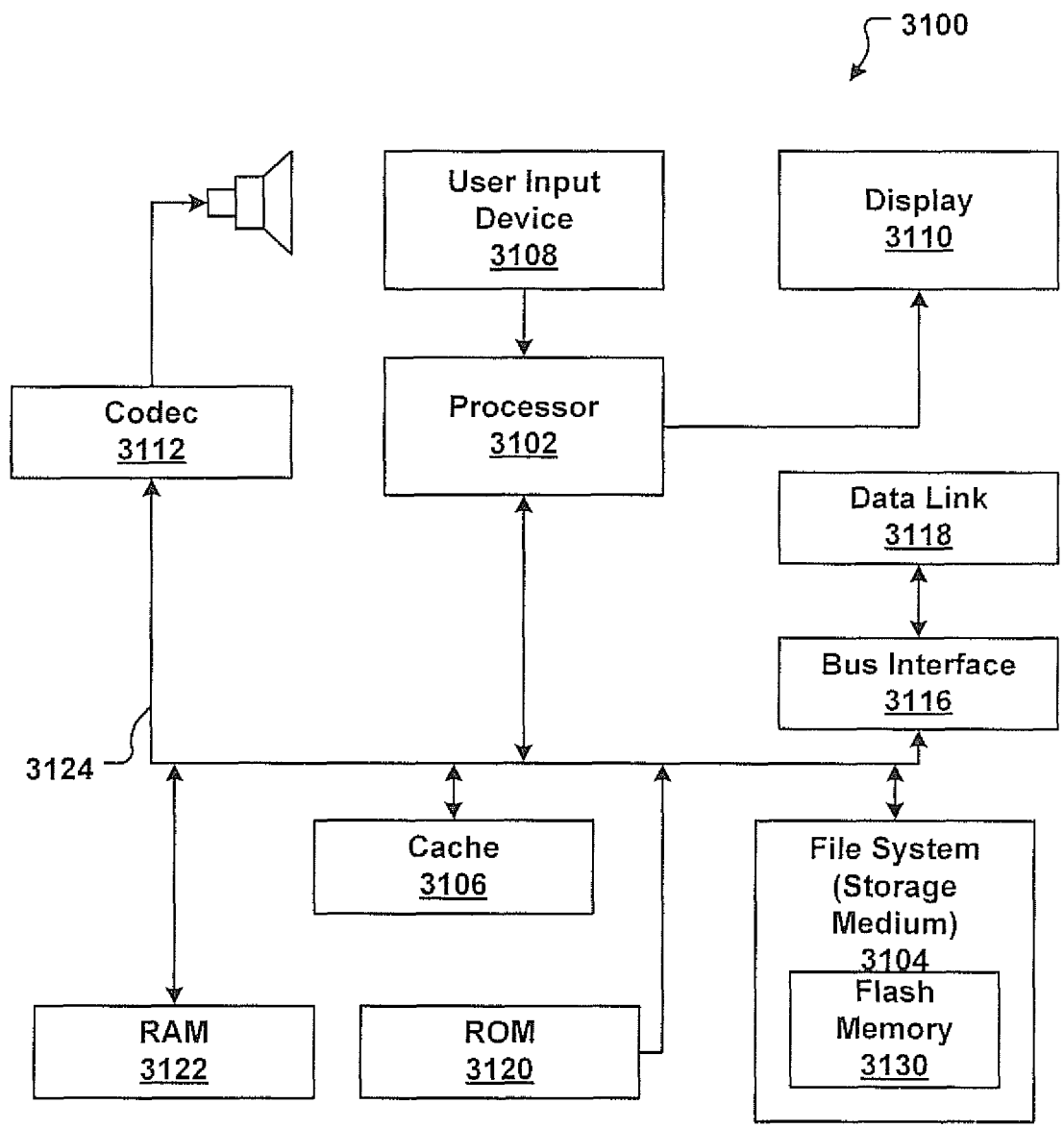
FIG. 14 shows an exemplary operating environment, in accordance with an embodiment of the invention.

FIG. 14 shows an exemplary system 3100 in accordance with an embodiment of the invention. System 3100 is well-suited for a number of applications, including digital audio players, digital cameras, digital video recorders, mobile phones, game cartridges, smartphones, personal digital assistants, set-top boxes, networking and telecommunication equipments, printers, computer peripherals, automotive navigation devices, portable multimedia devices, gaming systems, and the like. The system 3100 includes a processor 3102 that pertains to a microprocessor or controller for controlling the overall operation of the system 3100. The system 3100 also includes flash memory 3130. In the present embodiment, the flash memory 3130 may include: a first charge storage layer; a second charge storage layer, wherein the first and second charge storage layers comprise nitrides; and an insulating layer formed between the first and second multilayers, the insulating layer for providing insulation between the first and second charge storage layers. The flash memory 3130 may also include other features of a memory cell as described above. According to various embodiments, it is possible to provide a semiconductor device, such as flash memory, such that the memory cells therein each have two physically separated charge storage nodes. As a result, the flash memory 3130 can be manufactured in much smaller packages and much smaller geometries. This decreased size for the flash memory translates into decreased size for various devices, such as personal digital assistants, set-top boxes, digital video recorders, networking and telecommunication equipments, printers, computer peripherals, automotive navigation devices, gaining systems, mobile phones, cellular phones, internet protocol phones, and/or wireless phones.

In the case where the system 3100 is a portable media player, the system 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the system 3100.

The system 3100 may also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the system 3100 is a portable media player that is powered by a battery (not shown). The system 3100 also includes a RAM 3122 and a Read-Only Memory (ROM) 3120. The system 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The system 3100 also includes a user input device 3108 that allows a user of the system 3100 to interact with the system 3100. For example, the user input device 3108 can take a variety of forms, such as a button, keypad, dial, etc. Still further, the system 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The system 3100 also includes a bus interface 3116 that couples to a data link 3118. The data link 3118 allows the system 3100 to couple to a host computer.

In one embodiment, the system 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the system 3100 or external to the system 3100. For example, headphones or earphones that connect to the system 3100 would be considered an external speaker.

In a particular embodiment, the available media assets are arranged in a hierarchical manner based upon a selected number and type of groupings appropriate to the available media assets. For example, in the case where the system 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on. It is to be understood that the present invention is not limited in its application to the above-described embodiments. Needless to say, various modifications and variations of the present invention may be made without departing from the spirit and scope of the present invention.

Also, as mentioned above, flash memory is applicable to a variety of devices other than portable media devices. For instance, flash memory can be utilized in personal digital assistants, set-top boxes, digital video recorders, networking and telecommunication equipments, printers, computer peripherals, automotive navigation devices, and gaming systems.

Figure 15:
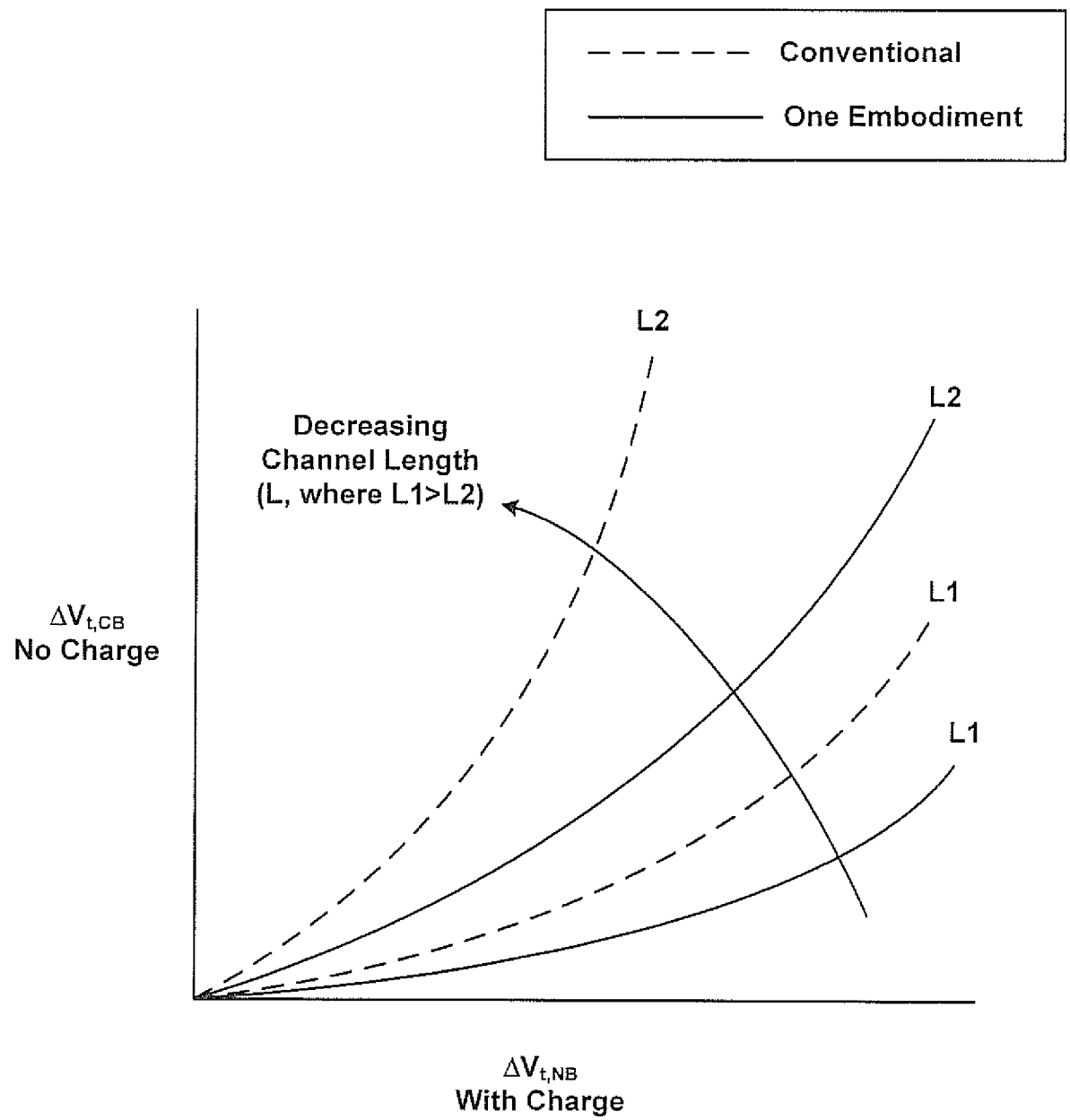
FIG. 15 illustrates advantages of memory cells according to one embodiment over conventional memory cell designs.

Various embodiments are thus described. FIG. 15 illustrates advantages of memory cells according to one embodiment (solid line) over conventional memory cell designs (dashed line). As shown in FIG. 12, for a given channel length (e.g., L1), the effect of program disturb in embodiments is much less than in conventional designs. Moreover, the effect of decreasing channel length (e.g., L2 vs. L1) is less significant with respect to the embodiment depicted as compared to conventional designs. Thus, embodiments provide for dual storage node memory cells with physical separation of the storage nodes by an insulator. Such separation of the storage nodes greatly reduces program disturb between the two storage nodes, which is a critical issue as process geometries continue to decrease.

Notwithstanding these improvements, embodiments also provide for a memory cell having a longer channel length than a conventional memory cell of similar cell size. Thus, the short channel effect is reduced even more.

Additionally, embodiments offer improved programming performance. For example, the unique channel geometry exhibited by embodiments may help the channel with hot electron injection programming efficiency. Therefore, the programming speed may be improved. Furthermore, with the use of certain materials as the charge storage layer 14, charges may be removed more efficiently from the charge storage elements 26, 28. Therefore, the Fowler-Nordheim (FN) erase method can be more readily used, resulting in improved reliability.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of fabricating spaced storage nodes on a surface of a substrate between two adjacent bit lines, the method comprising:
    forming a first oxide layer over the substrate extending between the two adjacent bit lines;
    forming a charge storage layer over the first oxide layer, wherein the charge storage layer comprises a nitride;
        forming a second oxide layer over the charge storage layer; removing a center portion of the second oxide layer; and after removing the center portion of the second oxide layer,
    chemically converting the nitride of a center portion of the charge storage layer into an oxide thereby replacing the center portion of the charge storage layer with an insulating layer between two side portions of the charge storage layer and over the first oxide layer extending between the two adjacent bit lines,
    wherein chemically converting the nitride of the center portion of the charge storage layer into the oxide is performed while retaining the two side portions of the charge storage layer and while retaining the first oxide layer extending between the two adjacent bit lines.

2. The method as recited in claim 1 further comprising:
    forming silicon oxide pillars on the surface of the substrate over each bit line prior to forming the charge storage layer.

3. The method as recited in claim 1 wherein the insulating layer electrically isolates a first portion of the charge storage layer from a second portion of the charge storage layer.

4. The method as recited in claim 1 further comprising:
    forming conductive word lines over the bit lines, a first portion of the charge storage layer and a second portion of the charge storage layer.

5. The method as recited in claim 1 wherein the nitride is selected from the group consisting of silicon nitride and silicon enriched nitride.

6. The method as recited in claim 1 further comprising:
    forming shallow trenches in the substrate between the adjacent bit lines prior to forming the charge storage layer.

7. The method as recited in claim 1 wherein forming the charge storage layer comprises forming a nitride layer with a thickness between 50 A and 120 A.

8. The method as recited in claim 7 wherein forming the first oxide layer comprises forming a first silicon oxide layer with a thickness between 30 A and 100 A.

9. The method as recited in claim 8 wherein forming the second oxide layer comprises forming a second silicon oxide layer with a thickness between 30 A and 100 A.

10. The method as recited in claim 1 wherein the insulating layer between two side portions of the charge storage layer and over the first oxide layer is operable as a gate oxide.

* * * * *